United States Patent
Liu

(10) Patent No.: US 11,108,916 B2
(45) Date of Patent: Aug. 31, 2021

(54) CALIBRATION TARGET SHIFT COMPENSATION

(71) Applicant: HEWLETT-PACKARD DEVELOPMENT COMPANY, L.P., Houston, TX (US)

(72) Inventor: Hsue-Yang Liu, Vancouver, WA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 606 days.

(21) Appl. No.: 16/075,599

(22) PCT Filed: Jul. 24, 2017

(86) PCT No.: PCT/US2017/043493
§ 371 (c)(1),
(2) Date: Aug. 4, 2018

(87) PCT Pub. No.: WO2019/022702
PCT Pub. Date: Jan. 31, 2019

(65) Prior Publication Data
US 2021/0211547 A1   Jul. 8, 2021

(51) Int. Cl.
H04N 1/00 (2006.01)
G06F 30/20 (2020.01)
H04N 1/03 (2006.01)
H04N 1/23 (2006.01)

(52) U.S. Cl.
CPC ......... *H04N 1/00031* (2013.01); *G06F 30/20* (2020.01); *H04N 1/00015* (2013.01); *H04N 1/00045* (2013.01); *H04N 1/00087* (2013.01); *H04N 1/03* (2013.01); *H04N 1/23* (2013.01)

(58) Field of Classification Search
CPC ........... H04N 1/00031; H04N 1/00015; H04N 1/00018; H04N 1/00045; H04N 1/00087; H04N 1/03; H04N 1/23; G06F 30/20
See application file for complete search history.

(56) References Cited

U.S. PATENT DOCUMENTS 6,435,652 B1   8/2002   Rezanka
6,517,180 B2   2/2003   Tullis et al.
(Continued)

OTHER PUBLICATIONS

"HP PageWide Technology", HP, Retrieved from Internet: "http://www.hp.com/hpinfo/newsroom/press_kits/2015/PageWideXL2015/PageWideTechnology.pdf", 2015, 8 pages.

*Primary Examiner* — Moustapha Diaby
(74) *Attorney, Agent, or Firm* — Mannava & Kang, P.C.

(57) ABSTRACT

According to examples, an apparatus may include a processor and a memory on which is stored machine readable instructions that are to cause the processor to determine a size of a chip gap between a first sensor chip and a second sensor chip, access a model that estimates an amount of positional shift of a target centroid, and apply the determined chip gap size and the accessed model on an image captured using the first sensor chip and the second sensor chip to compensate for an estimated positional shift in a centroid of a calibration target in the captured image by causing a location of the calibration target centroid in the captured image to more accurately correspond to an actual location of the calibration target centroid on an object from which the captured image was captured.

15 Claims, 5 Drawing Sheets

(56) References Cited

U.S. PATENT DOCUMENTS

| | | | |
|---|---|---|---|
| 6,600,568 B1* | 7/2003 | Lu ........................ | G01B 11/14 |
| | | | 356/614 |
| 6,707,022 B2 | 3/2004 | Perregaux | |
| 7,023,581 B2 | 4/2006 | Subirada et al. | |
| 7,054,034 B2 | 5/2006 | Underwood et al. | |
| 7,980,654 B2 | 7/2011 | Mongeon et al. | |
| 8,534,792 B2 | 9/2013 | Geurts | |
| 9,073,312 B2 | 7/2015 | Abello et al. | |
| 2003/0001077 A1* | 1/2003 | Perregaux ......... | H01L 27/14806 |
| | | | 250/208.1 |
| 2007/0216793 A1* | 9/2007 | Kuwazawa .......... | H04N 1/1934 |
| | | | 348/315 |
| 2010/0033768 A1* | 2/2010 | Hamada .............. | H04N 1/1917 |
| | | | 358/474 |
| 2011/0200346 A1* | 8/2011 | Hosier ............... | G03G 15/5041 |
| | | | 399/49 |

* cited by examiner

CALIBRATION TARGET SHIFT COMPENSATION

BACKGROUND

Scanners often use a light source to illuminate a section of an original item. A lens or an array of lenses redirects light reflected from or transmitted through the original item so as to project an image of a scan line onto a plurality of sensor chips arranged along the scan line. Each of the sensor chips includes light-sensitive elements that produce respective electrical signals related to the intensity of light falling on the element, which is in turn related to the reflectance, transmittance, or density of the corresponding portion of the original item. These electrical signals are read and numerical values are assigned to the electrical signals. A scanning mechanism typically sweeps the scan line across the original item so that the light-sensitive elements read the successive scan lines. By associating the numerical values with their corresponding locations on the original item being scanned, a digital representation of the scanned item may be constructed.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1:
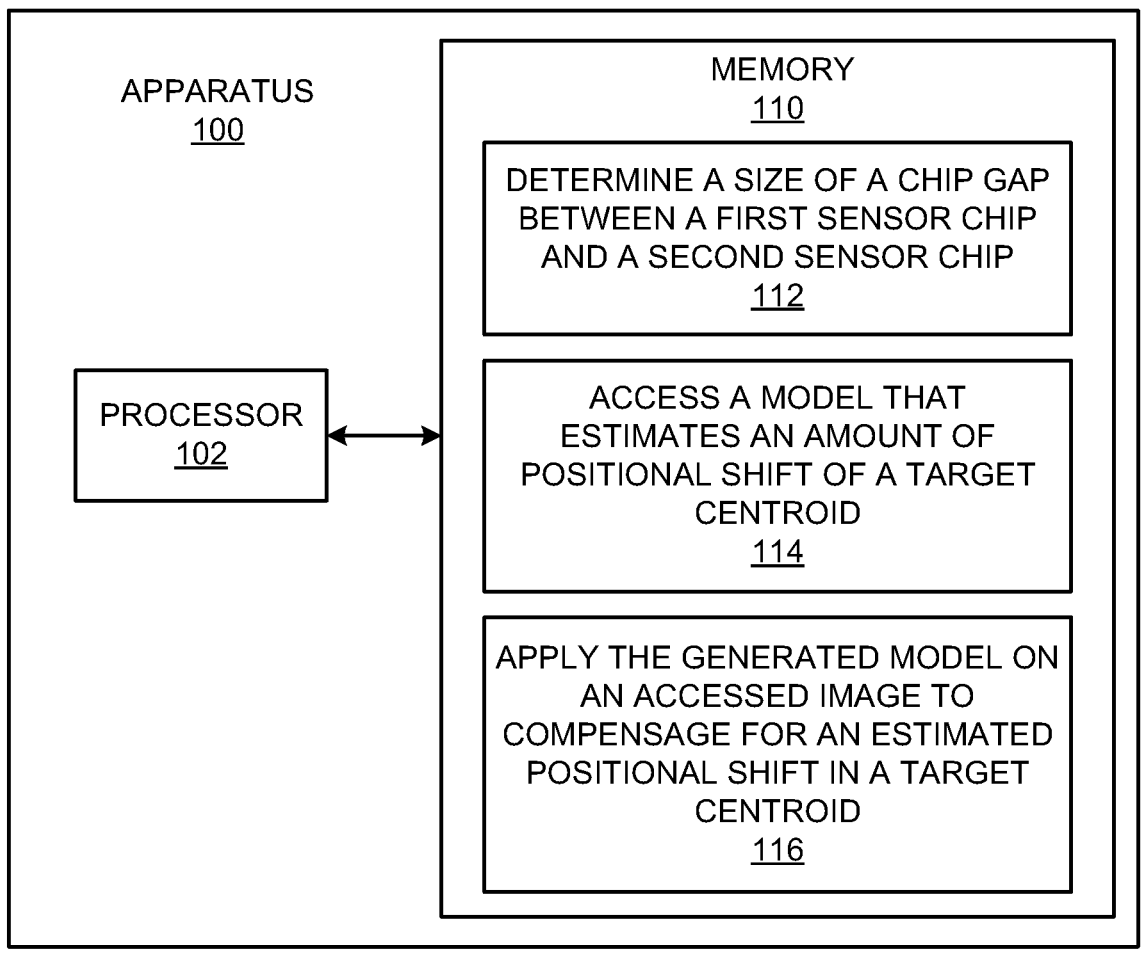
FIG. 1 shows a block diagram of an example apparatus that may be implemented to compensate for a positional shift of a target centroid in a captured image.

Print die in printers may be offset from each other and may be positioned at locations other than their exact intended locations, for instance, due to tolerances in the manufacture of the print die. As such, printers that employ multiple print die composed of a plurality of nozzles may be calibrated to ensure that the nozzles are fired at correct, e.g., calibrated, times to ensure that print fluid, such as, ink, may accurately be applied to a medium, such as a sheet of paper, a layer of build material particles, etc. One manner in which the print die may be calibrated may be through the printing of a test pattern of targets using the print die, scanning of the printed test pattern using a scan bar, and determining whether the targets in the printed test pattern of the scanned image are in their intended locations. In addition, the print die may be calibrated from the determination. However, if the locations of the targets in the scanned image differ from their actual locations in the test pattern, the print die may not be accurately calibrated.

The locations of the targets in the scanned image may not accurately reflect the actual locations of the targets in instances in which the scan bar includes multiple sensor chips arranged in an aligned configuration along the scan bar in which the sensor chips are separated from each other by respective chip gaps. Scan bars having this type of configuration may be relatively less expensive than other types of scan bars and thus, this type of scan bar may be implemented in printers to reduce the costs associated with manufacturing those printers. In any regard, the chip gap may result in data corresponding to an image being missed as the sensor chips may not capture an image of portions covered by the chip gaps. As a result, when the captured image is generated, the missing data may cause portions of the image to be shifted such that the captured image is thinner than the original image. That is, centroids of targets in the captured image may be shifted such that targets on opposite sides of the positions corresponding to the chip gaps may be closer to each other than the centroids of the targets that are not on opposite sides of those positions.

Disclosed herein are apparatuses and methods that may be employed to compensate for an estimated positional shift in a calibration target centroid in a captured image caused by a chip gap between sensor chips in a scan bar used to capture the image. In the apparatuses and methods disclosed herein, a size, e.g., a width, of a chip gap between a first sensor chip and a second sensor chip in the scan bar may be determined. In addition, a model that estimates an amount of positional shift of a target centroid may be accessed, e.g., selected from a plurality of models, generated, or the like. In addition, the determined chip size and the accessed model may be applied on the captured image to cause the location of the calibration target centroid to more accurately correspond to an actual location of the calibration target centroid on an object form which the captured image was captured. As discussed herein, the model may pertain to a particular set of features including a location of a chip, a type of the target, and a size of the target and multiple ones of the models may pertain to different sets of features.

Through implementation of the apparatuses and methods disclosed herein, positional shifts in the locations of calibration target centroids caused by chip gaps between sensor chips in a sensor bar may be moved by an amount that compensates for the positional shifts. In one regard, therefore, the apparatuses and methods disclosed herein may enable printers to use scan bars having contact image sensor chips with chip gaps between the sensor chips to accurately calibrate print die. In addition, such printers may be fabricated in a relatively inexpensive manner while still enabling the print die to be accurately calibrated.

Before continuing, it is noted that as used herein, the terms "includes" and "including" mean, but is not limited to, "includes" or "including" and "includes at least" or "including at least." The term "based on" means "based on" and "based at least in part on."

Reference is first made to FIG. 1, which shows a block diagram of an example apparatus 100 that may be implemented to compensate for a positional shift of a target centroid in a captured image. It should be understood that the apparatus 100 depicted in FIG. 1 may include additional components and that some of the components described herein may be removed and/or modified without departing from a scope of the apparatus 100 disclosed herein.

The apparatus 100 may be a computing apparatus, e.g., a personal computer, a laptop computer, a tablet computer, a smartphone, or the like. In these examples, the apparatus 100 may be separate from a printing system, which may be 2D printing system or a 3D printing system and may communicate instructions to the printing system over a direct or a network connection. In other examples, the apparatus 100 may be part of a printing system. In these examples, the apparatus 100 may be part of a control system of the printing system and may communicate instructions to printing components, e.g., printheads, of the printing system, for instance, over a bus.

The apparatus 100 may include a processor 102 that may control operations of the apparatus 100. The processor 102 may be a semiconductor-based microprocessor, a central processing unit (CPU), an application specific integrated circuit (ASIC), a field-programmable gate array (FPGA), a graphics processing unit (GPU), a tensor processing unit (TPU), and/or other hardware device. The apparatus 100 may also include a memory 110 that may have stored thereon machine readable instructions 112-116 (which may also be termed computer readable instructions) that the controller 102 may execute. The memory 110 may be an electronic, magnetic, optical, or other physical storage device that contains or stores executable instructions. The memory 110 may be, for example, Random Access memory (RAM), an Electrically Erasable Programmable Read-Only Memory (EEPROM), a storage device, an optical disc, and the like. The memory 110, which may also be referred to as a computer readable storage medium, may be a non-transitory machine-readable storage medium, where the term "non-transitory" does not encompass transitory propagating signals.

The processor 102 may fetch, decode, and execute the instructions 112 to determine a size of a chip gap between a first sensor chip and a second sensor chip of a sensor bar. As discussed herein, the position of a target centroid may shift due to an impact of a chip gap between the sensor chips in a scan bar that captured the image having the target. The target, which may also be referenced as a calibration target, may be an element, e.g., a printed feature, having a particular shape and may be part of a pattern of targets that may be used to calibrate, for instance, print bar to print bar positions, print die to print die positions, etc.

The processor 102 may fetch, decode, and execute the instructions 114 to access a model that estimates and amount of positional shift of a target centroid. In addition, the processor 102 may fetch, decode, and execute the instructions 116 to apply the determined chip gap size and the accessed model on a captured image having a target to compensate for an estimated positional shift in a centroid of the target in the accessed image by causing a location of the target centroid in the captured image to more accurately correspond to an actual location of the target centroid on an object or item from which the captured image was captured.

Figure 2A:
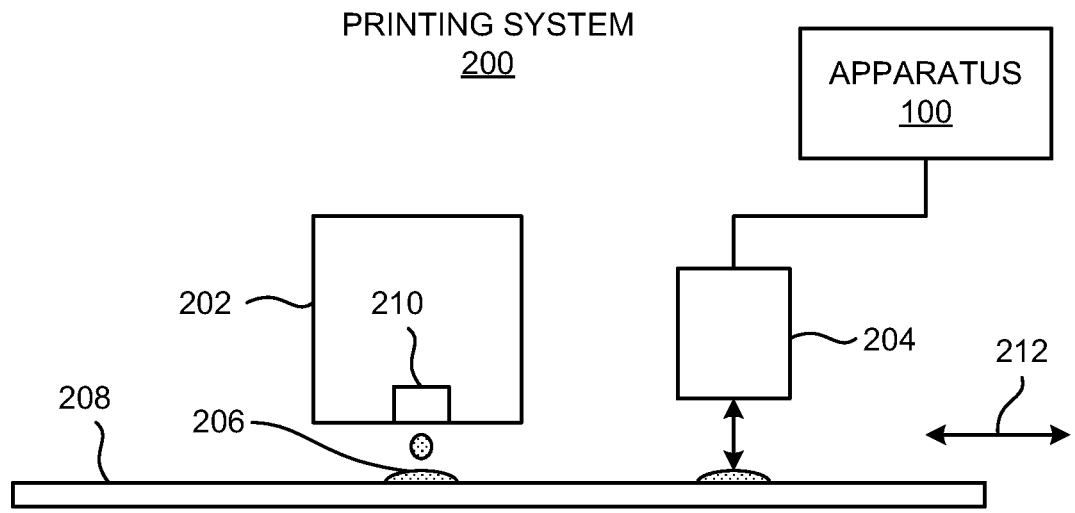
FIG. 2A shows a schematic diagram of a printing system in which the apparatus depicted in FIG. 1 may be implemented according to one example.

Turning now to FIG. 2A, there is shown a schematic diagram of a printing system 200 in which the apparatus 100 depicted in FIG. 1 may be implemented. It should be understood that the printing system 200 depicted in FIG. 2A may include additional components and that some of the components described herein may be removed and/or modified without departing from a scope of the printing system 200 disclosed herein.

As shown in FIG. 2A, the printing system 200 may include an agent delivery device 202, a scan bar 204, and the apparatus 100. The agent delivery device 202 may deposit an agent 206 onto an object 208 through nozzles 210. The agent 206 may be a marking agent, a fusing agent, a detailing agent, or the like. In some examples, the printing system 200 may be 2D printing system and the object 208 may be a media, such as a sheet of paper and the agent 202 may partially be absorbed into the media 208. In other examples, the printing system 200 may be a 3D printing system and the object 208 may be a layer or multiple layers of build material particles from which 3D parts may be fabricated and the agent 202 may be absorbed between the build material particles. In any of these examples, the agent delivery device 202 may be controlled to deposit the agent 206 at selected locations on the object 208 to form an intended image or intended portions of a 3D part. In addition, the agent delivery device 202, which may include a print bar or multiple print bars, in which each of the print bars has a single print die or a plurality of print die, may have a plurality of nozzles 210 through which the agent 206 may be delivered. In examples in which the agent delivery device 202 includes multiple print die, the print die may be positioned in an offset arrangement with respect to each other such that portions of multiple ones of the print die are able to print onto the same locations on the object 208.

The nozzles 210 in the agent delivery device 202 may undergo a calibration operation to ensure that droplets of the agent 206 may be delivered accurately onto the object 208. That is, a calibration operation may be implemented to calibrate the multiple print bars, multiple print die, etc., such that the nozzles 210 in the agent delivery device 202 may be operated to accurately deposit the agent 206.

During the calibration operation, the agent delivery device 202 may be implemented to print the agent 206 into a test pattern of targets and the scan bar 204 may be implemented to capture images of the targets included in the printed test pattern. The locations of the targets in the captured images may be compared with actual known locations of the targets to determine whether any of the targets has been printed in an unintended location. If the scan bar 204 does not accurately generate a captured image from the scan, the locations of the targets in the captured images may not be accurate, which may occur due to chip gaps between sensor chips in the scan bar 204. As discussed herein, the apparatus 100 may implement features to compensate for some of the errors caused by the chip gaps.

During printing and/or the calibration operation, the object 208 may be moved in either or both of the directions denoted by the arrow 212 with respect to the agent delivery device 202 and the scan bar 204. The object 208 may also be moved in a direction or directions that are transverse to the directions denoted by the arrow 212. In addition, or in other examples, the agent delivery device 202 may be moved in either or both of the directions denoted by the arrow 212 with respect to the scan bar 204 and the object 208 during a printing operation. The agent delivery device 202 may also be moved in a direction or directions that are transverse to the directions denoted by the arrow 212. In addition, or in further examples, the scan bar 204 may be moved in either or both of the directions denoted by the arrow 212 with respect to the scan bar 204 and the object 208 during a calibration operation. However, in some examples, the scan bar 204 may not be movable in either of the directions that are transverse to the directions denoted by the arrow 212. Instead, the scan bar 204 may be fixed in the directions that are transverse to the directions denoted by the arrow 212. The scan bar 204 may also, in some examples, be fixed with respect to the directions denoted by the arrow 212.

In other examples, the scan bar 204 may not be integrated with the printing system 200. For instance, the scan bar 204 may be part of another device, such as a scanning device. In these examples, the agent delivery device 202 may be implemented to print the agent 206 into a test pattern of targets, e.g., a print calibration page, and a user may manually move the printed page to a device including the scan bar 204.

Figure 2B:
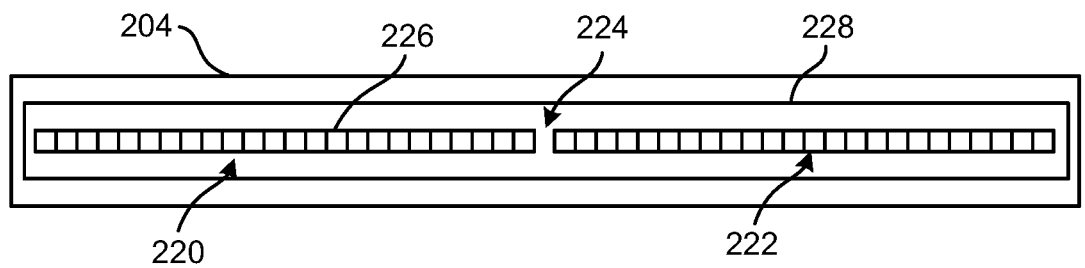
FIG. 2B shows a bottom view of the scan bar depicted in FIG. 2A according to one example.

Turning now to FIG. 2B, there is shown a bottom view of the scan bar 204 depicted in FIG. 2A. Although not shown, the scan bar 204 may include additional components including a supporting structure, light shielding, a light source, lenses, etc., which have been omitted from the figure for purposes of clarity. According to examples, the scan bar 204 may be a stationary contact image sensor scan bar and may extend the width of the object 208 onto which the agent 206 may be deposited. In other words, the scan bar 204 may be a page wide scan bar. In addition, the scan bar 204 may include a first sensor chip 220 and a second sensor chip 222 that may be aligned with each other along a direction that is parallel to the width of the object 208.

A chip gap 224 may exist between the first sensor chip 220 and the second sensor chip 222 due to physical footprints of the first sensor chip 220 and the second sensor chip 222 as well as manufacturing tolerances. In one regard, the scan bar 204 may be relatively less expensive than movable scan bars, scan bars that employ charge-coupled devices, and/or scan bars having sensor chips that are in offset positions with respect to each other such that chip gaps do not exist between the sensor chips. Additionally, the scan bar 204 may be relatively less expensive and relatively easier to manufacture than scan bars having a single sensor chip that extends the length of the scan bar 204.

The first sensor chip 220 and the second sensor chip 222, which may also be called a first sensor die 220 and a second sensor die 222, may each include an array of light-sensitive elements 226. Each of the light-sensitive elements 226 may be considered as a pixel, which may also refer to a corresponding area of an original object 208 that is imaged onto that portion, or the digital value corresponding to a location in a digital image. It should be understood that the sensor bar 204 has been depicted with two sensor chips 220, 222 and that the sensor chips 220, 222 have each been depicted with a relatively small number of light-sensitive elements 226 for clarity of illustration. In other examples, the sensor bar 204 may include any number of sensor chips 220, 222, e.g., 10 or more sensor chips, with each of the sensor chips 220, 222 having any number of light-sensitive elements 226, e.g., hundreds, thousands, or millions of individual light-sensitive elements 226. The number of light-sensitive elements 226, e.g., pixels, per linear unit of sensor defines the scan bar's spatial sampling rate, which is also often called the scan bar's resolution. The scan bar may have a resolution of 300, 600, 1200, or 2400 pixels per inch, although other resolutions are possible.

The sensor chips 220, 222 may be placed on a circuit board 228, although the sensor chips 220, 222 may also be placed on separate circuit boards. In any regard, the positional accuracy of the light-sensitive elements 226 as well as the sensor chips 220, 222 may be determined by the placements of the light-sensitive elements 226 on the circuit board 228. For instance, each of the sensor chips 220, 222 may be displaced from their respective ideal positions due to manufacturing tolerances, which may result in the chip gap 224 varying from one scan bar 204 to another scan bar 204.

Figure 3:
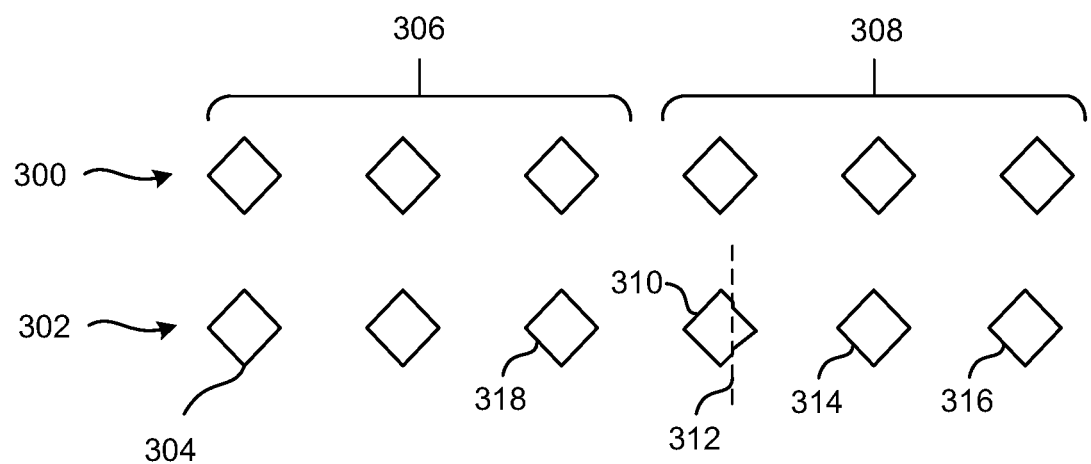
FIG. 3 shows a diagram of a first row of targets under an ideal condition and a second row of targets that are impacted by a chip gap between sensor chips in a scan bar according to one example.

The chip gap 224 may impact an image captured with the scan bar 204 as discussed with respect to FIG. 3, which shows a first row 300 and a second row 302 of targets 304. The first row 300 of targets 304 may depict an ideal condition in which there is no impact on a scanned image of the targets 304 caused by a chip gap 224. The second row 302 of targets 304 may depict an impact on a scanned image of the targets 304 caused by a chip gap 224.

The targets 304 may be elements of a pattern that the agent delivery device 202 may have printed to be implemented in a calibration operation. A first print die 306 may have printed the targets 304 on the left half of FIG. 3 and a second print die 308 may have printed the targets 304 on the right half of FIG. 3. In addition or in other examples, another printing system may have printed the targets 304 in the first row 300 on a test sheet, in which the targets 304 in the first row 300 are accurately positioned at intended locations on the test sheet. In any regard, although the targets 304 have been depicted as having diamond shapes, the targets 304 may have any shape, such as, circles, squares, rectangles, triangles, etc. Particularly, for instance, the targets 304 may have any shape for which a centroid, e.g., a center of mass, of the shape may be determined from images of the targets 304 captured by the scan bar 204.

Generally speaking, when the scan bar 204 is used to capture an image of the targets 304 from an object 208, e.g., a test sheet, the chip gap 224 may result in data being missed at the location of the chip gap 224. Thus, a scanned image of the targets 304 may result in the centroid of a target 310 being shifted by an amount equivalent to the missing data caused by the chip gap 224. That is, the chip gap 224 may result in a gap in data representing the scanned image and thus, when images captured by respective sensor chips 220, 222 are stitched together, the gaps in the data may result in features in the images appearing closer together than the features actually are in the original object 208. This missing data and the resulting shift is denoted by the dashed line 312. As a portion of the target 310 is missing from the scanned image, the target 310 is relatively smaller than the other targets 304 and thus, the centroid of the target 301 is shifted, for instance, to the left in FIG. 3. In addition, the other targets 314 and 316 to the right of the target 310 may also have shifted to the left by the amount of the missing data. As a result, the chip gap 224 may cause the distance between the centroid of the target 310 and a neighboring target 318 to be smaller than the distance between the centroids of the targets 304 in the first row 300.

In some instances, the chip gap 224 may overlap with boundary regions of the print die 306, 308 as shown in FIG. 3. The boundary regions of the print die 306, 308 may be the regions shown in FIG. 3 between the print die 306, 308. The missing data caused by the chip gap 224 may result in an invalidation of an alignment measurement between the print die 306, 308 due to the physical chip gap 224. As discussed herein, the apparatus 100 may implement operations to mitigate the impact of the chip gap 224 on the alignment measurement of the print die 306, 308.

Figure 4:
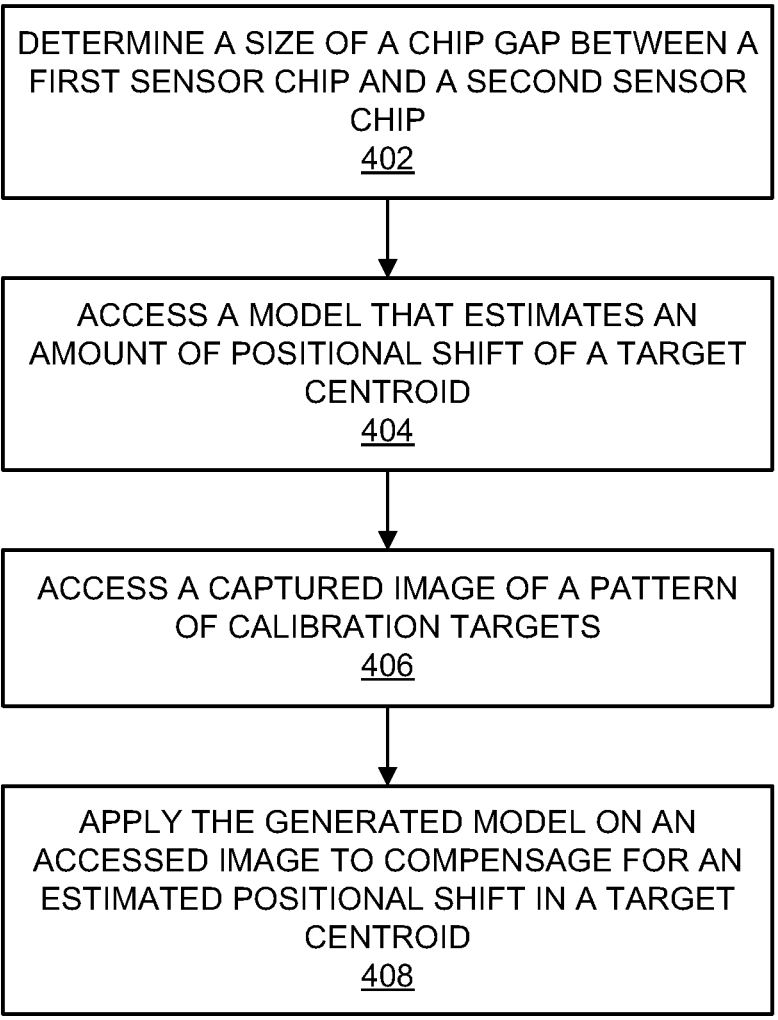
FIGS. 4 and 5, respectively, show flow diagrams of example methods for compensating for an estimated positional shift in a target centroid.
Figure 5:
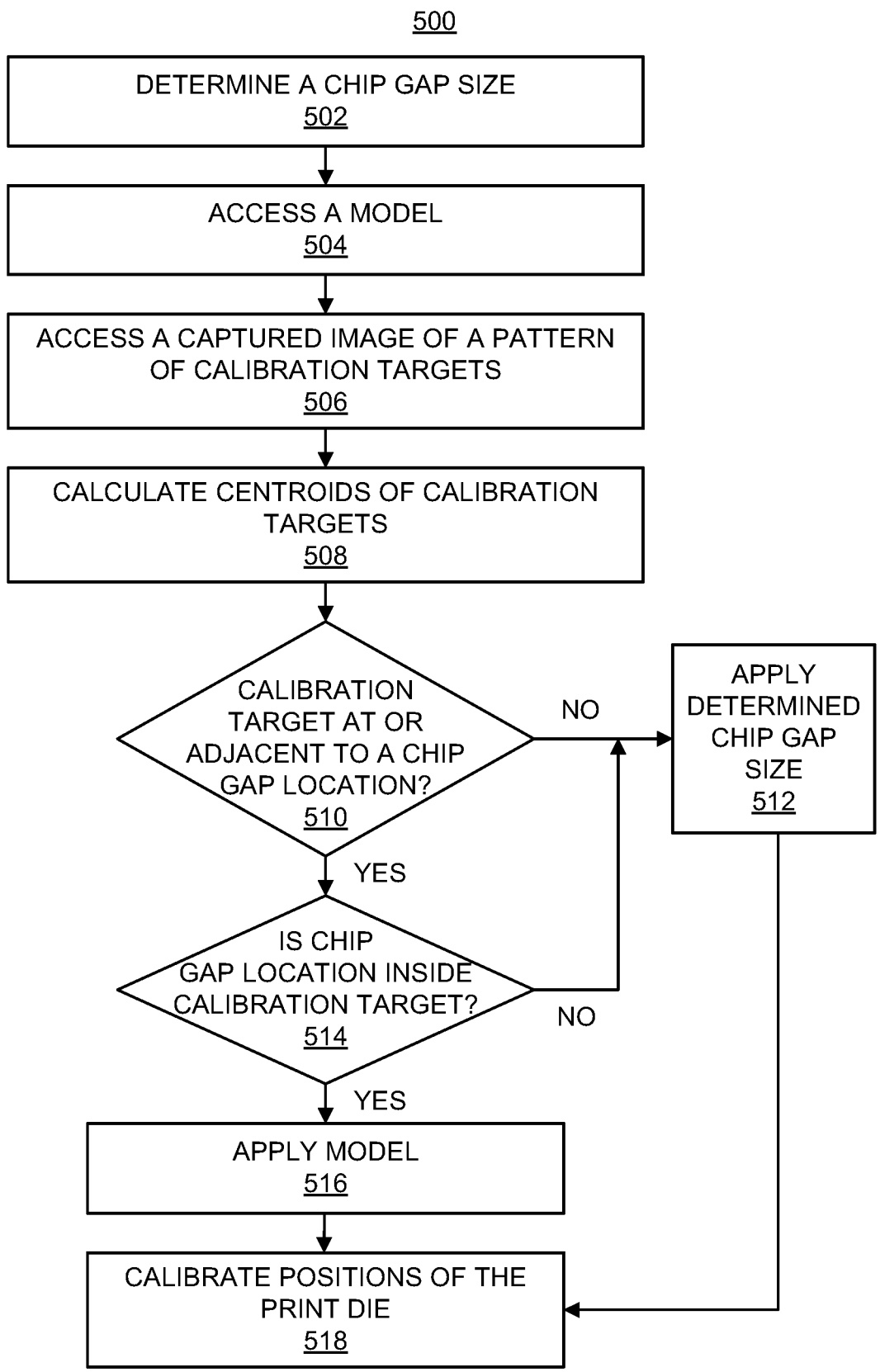
Figure 6:
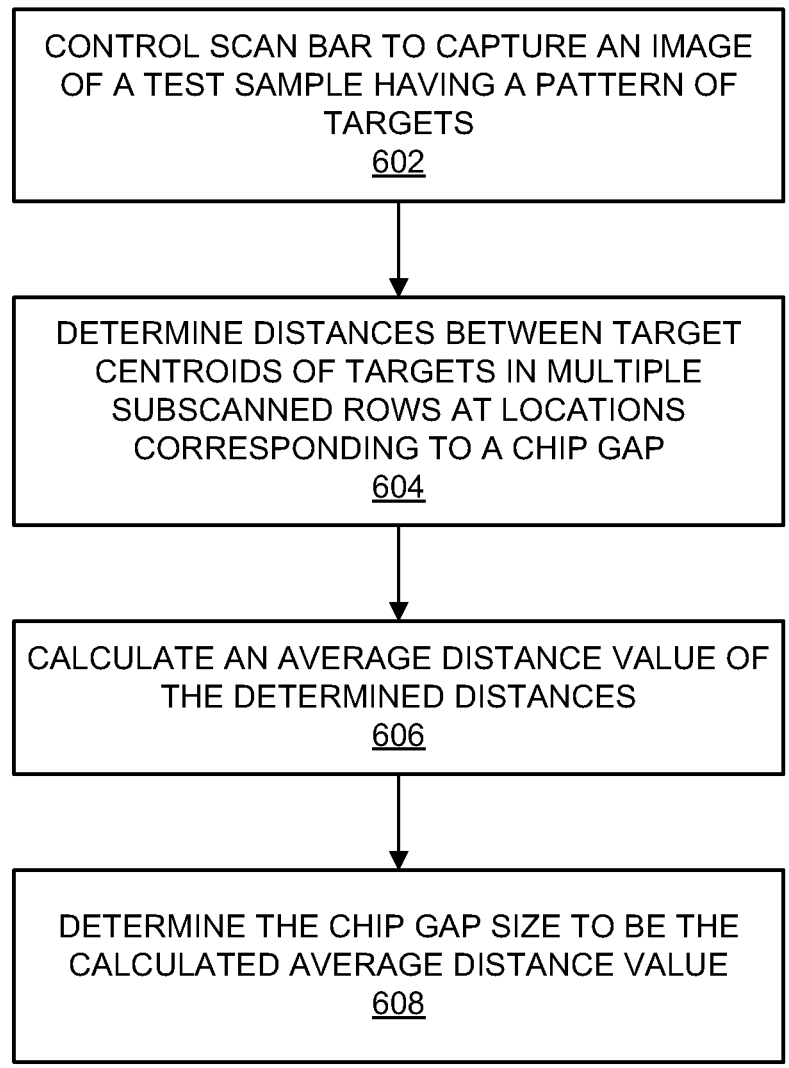
FIG. 6 shows a flow diagram of an example method for determining a chip gap size through measurements of distances between targets in a test sample.

Various manners in which the apparatus 100 and the printing system 200 may be implemented are discussed in greater detail with respect to the methods 400-600 depicted in FIGS. 4-6. Particularly, FIGS. 4 and 5, respectively, depict example methods 400, 500 for compensating for an estimated positional shift in a target centroid. In addition, FIG. 6 shows a flow diagram of an example method for determining a chip gap size through measurements of distances between targets in a test sample. It should be apparent to those of ordinary skill in the art that the methods 400-600 may represent a generalized illustration and that other operations may be added or existing operations may be removed, modified, or rearranged without departing from the scopes of the methods 400-600.

The descriptions of the methods 400-600 are made with reference to the apparatus 100, the printing system 200, and the test pattern illustrated in FIGS. 1-3 for purposes of illustration. It should be understood that apparatuses and printing systems having other configurations may be implemented to perform the methods 400-600 without departing from the scopes of the methods 400-600.

At block 402, the processor 102 may execute the instructions 112 to determine a size of a chip gap 224 between a first sensor chip 220 and a second sensor chip 222. As discussed herein, the size of the chip gap 224 may be determined through a measurement of the distance between adjacent target centroids in an image of a test pattern of targets.

At block 404, the processor 102 may execute the instructions 114 to access a model that estimates an amount of positional shift of a target centroid. In some examples, a plurality of models corresponding to different sets of features may have been created and stored in a memory, such as memory 110. Each of the models may have been created to predict the impact of a particular chip gap size on positions of targets based upon the different sets of features. For instance, a first model may have been created for a first chip gap location, e.g., a location of the chip gap in a particular sensor bar 204, a first target type, e.g., a square target, a first target size, and the like. In addition, a second model may have been created for a second chip gap location, a first target type, a first target size, etc. Additional models corresponding to different combinations of features may also have been created and stored. Thus, in some examples the processor 102 may access the model from the plurality of models that corresponds to the features of the printing system 200 to be calibrated using the type and size of targets. In some examples, the model may be a linear model (e.g., a first order function), a second order or higher polynomial function, or the like.

In other examples, the processor 102 may access the model by generating the model. Particularly, the processor 102 may generate a model that estimates a positional shift of a target centroid, e.g., a center of mass of a target, in a captured image due to an impact of a chip gap 224 between sensor chips 220, 222 in a scan bar 204 that captured the image As noted herein, the target 304, which may also be referenced as a calibration target, may be a printed element having a particular shape and may be part of a pattern of targets (FIG. 3) that may be used to calibrate, for instance, print bar to print bar positions, print die to print die positions, etc., in an agent delivery device 202. Various manners in which the model or models may be generated are discussed in greater detail herein.

At block 406, the processor 102 may access an image of a pattern of calibration targets captured with the sensor chips 220, 222 of the scan bar 204. As noted above, the accessed image may be impacted by the chip gap 224 between the sensor chips 220, 222 in the scan bar 204. That is, data may be missing from a portion of an image captured by the sensor chips 220, 222 and thus, when the captured image is generated, e.g., stitched together, the missing data may result in features such as the calibration target centroid being shifted by a distance that is equivalent to the missing data. As a result, the exact locations of the calibration targets in an original object 208 may not be determined from the accessed image of the calibration targets.

At block 408, the processor 102 may execute the instructions 116 to apply the determined chip gap size and the accessed model on the accessed image to compensate for an estimated positional shift caused by the chip gap 224 in a centroid of the calibration target 304 in the pattern of calibration targets. As noted above, the accessed model may correspond to a particular chip gap size. In this regard, the processor 102 may use the determined chip gap size to scale the accessed model to more accurately correspond to the sensor bar 204 used to capture the accessed image. In some examples in which the accessed model corresponds to the chip gap size between the first and second sensor chips 220, 222, the access model may be applied without being scaled using the determined chip gap size. In other examples, the determined chip gap size may still be used to scale the accessed model, but the scaling may be one to one.

In addition, compensation of the estimated positional shift in the calibration target 304 centroid may be performed to cause a location of the calibration target centroid in the accessed image to more accurately correspond to an actual location of the calibration target centroid on an object 208 from which the accessed image of the pattern of calibration targets was captured. As discussed herein, by accurately positioning the calibration target centroid in the captured image, the locations of the calibration targets may be used to more accurately calibrate the printheads, print die, etc.

Turning now to FIG. 5, there is shown a flow diagram of another example method 500 for compensating for an estimated positional shift in a target centroid. At block 502, the processor 102 may execute the instructions 112 determine a chip gap size between a first sensor chip 220 and a second sensor chip 222. FIG. 6 depicts an example implementation in which the processor 102 may determine the chip gap size through measurements of distances between targets in a test sample. As shown in FIG. 6, the processor 102 may control the scan bar 204 to capture an image of a portion of a test sample having a pattern of targets that are spaced apart from each other at a known distance with respect to each other. For instance, the targets may be arranged in a two-dimensional array on the test sample such that targets are aligned along the scanning direction and along the subscanning direction. Thus, the targets in each subscanning row in the pattern of targets may be spaced at a predefined distance with respect to each other such that the targets are spaced evenly across the subscanning row.

In any regard, the test sample, which may be a pre-printed sheet upon which the pattern of targets has been printed at known distances with respect to each other, may be placed in a position to be scanned by the scan bar 204. In some examples, the location of the chip gap 224 may be known and the targets may be printed on the test sample such that the targets do not overlap that location. In addition, the processor 102 may activate the scan bar 204 to capture an image of the test sample, for instance, as the test sample and/or the scan bar 204 are scanned in a scanning direction 212. As discussed herein, the scan bar 204 may not be moved in the subscanning direction, e.g., to simplify the scan bar 204 and thus reduce costs associated with using the scan bar 204. Instead, the scan bar 204 may be a page wide scan bar and may thus extend the width of the test sample.

The scanned image may include a plurality of rows of targets, e.g., each of the subscanned rows. At block 604, the processor 102 may determine distances between the centroids, e.g., the centers of mass, of the targets in each of multiple subscanned rows containing targets. The processor 102 may also determine which of the distances corresponds to positions of the chip gap 224 in the scanned image. As noted above with respect to FIG. 3, the chip gap 224 may impact the scanned image by causing portions of the scanned image to be shifted due to missing data corresponding to the location of the chip gap 224. In this regard, the processor 102 may determine which of the distances corresponds to positions of the chip gap 224 by identifying which of the distances differs from, e.g., is smaller than, the other distances between the targets.

At block 606, the processor 102 may calculate an average distance value of the distances determined at block 604. That is, the processor 102 may calculate an average distance value of the distances corresponding to positions of the chip gap 224 in multiple subscanned rows of the scanned image. The average distance value may be calculated because the scan bar 204 may be a stationary contact image sensor scan bar, which may have a lower level of accuracy as compared with other types of sensors, such as charge-coupled device scan bars. For instance, data from the light-sensitive elements 226 of the scan bar 204 may result in relatively more noise than other types of more accurate sensor elements. As such, the subscanned rows of targets may not be imaged identically and thus, there may be some variations in the positions of the targets between the subscanned rows. By way of example, the scanned image may depict the neighboring targets in one subscanned row as having a first distance between them and the neighboring targets in a next subscanned row as having a second distance between them.

At block 608, the processor 102 may determine the chip gap size to be the calculated average distance. The processor 102 may also store the generated model, for instance, in the memory 210.

In some implementations in which the scan bar 204 includes multiple chip gaps 224 between multiple sensor chips, the test sample may be created such that the targets do not overlap the locations of the chip gaps 224. In addition, at block 604, the distances between target centroids of targets in multiple scanned rows at locations corresponding to each of the chip gaps 224 may be determined. Moreover, the average distance values of each of the determined distances may be calculated at block 606 and the model may be generated to include the average distance values as the sizes of each of the respective chip gaps 224. In some examples, the test sample may be accurately printed using a page wide array printing system in which the print die are offset along an agent delivery device 202 such that the targets do not overlap known positions of the chip gaps 224. In addition, the average measured chip gap size may be used for all of the chip gaps 224, for instance, because most chip gaps in the same batch of scan bars may be relatively consistent.

With reference back to FIG. 5, at block 504, the processor 102 may execute the instructions 114 to access a model that estimates than amounts of positional shift of a target centroid. In some examples, the processor 102 may generate the model through implementation of a simulation. The simulation may be performed using a geometrical model, a print simulation, real print samples, or the like. That is, for instance, the processor 102 may perform a set of simulations based upon the type, e.g., the shape, of the targets, the size of the targets, the location of the chip gap, the width of the chip gap, etc., to determine the model that predicts the impact of the chip gap on a captured image.

According to examples, a plurality of models may be generated, in which each of the models may be generated through implementation of simulations on different types of targets, different sizes of targets, different chip gap locations, different chip gap widths, or the like, as discussed above.

With reference back to FIG. 5, at block 506, an image of a pattern of calibration targets captured with a scan bar 204 may be accessed. An agent delivery device 202 having print die with spaces between the print die may have printed the pattern of calibration targets. The calibration targets may be printed in aligned rows and columns as discussed above.

At block 508, the processor 102 may calculate the centroids of the calibration targets in the accessed image. The processor 102 may calculate the centroids through any suitable image processing techniques. In addition, at block 510, the processor 102 may determine whether any of the calibration targets is at or adjacent to a chip gap 224 location. That is, the chip gap 224 location may have been previously determined and stored, for instance, in the memory 210 and the processor 102 may determine the chip gap 224 location from the memory 210. The processor 102 may additionally or in other examples, determine the chip gap 224 location in the accessed image based upon a calculation of the distances between the calibration targets. In any regard, in response to a determination none of the calibration targets are at or are adjacent to a chip gap 224 location in the accessed image, the processor 102 may apply the determined chip gap size on the accessed image to compensate for an estimated positional shift caused by the chip gap 224 as indicated at block 512.

However, in response to a determination that the calibration target is at or adjacent to a chip gap 224 location, the processor 102 may determine whether the chip gap 224 location is inside of the calibration target at block 514. In response to a determination that the chip gap 224 location is outside of the calibration target, the processor 102 may apply the determined chip gap size as indicated at block 512. That is, for instance, the processor 102 may apply a compensation amount that is based upon measurements of distances between targets in a test sample. However, in response to a determination that the chip gap 224 location is within the calibration target, the processor 102 may apply the model accessed at block 504 to compensate for the estimated positional shift of the calibration target centroid as indicated at block 516. That is, for instance, the processor 102 may apply a model that is based upon performance of a simulation according to a type, a size, etc., of the targets in the image accessed at block 506. In addition, in applying the model at block 516, the model may be scaled based upon the chip gap size determined at block 502 as discussed herein.

Following either of blocks 512 and 516, the processor 102 may calibrate the positions of the print die in the agent delivery device 202 using the location of the calibration target centroid in the accessed image following compensation of the calibration target centroid in the accessed image for the estimated positional shift on the accessed image caused by the chip gap 224. Through implementation of the compensated calibrated target centroid for the compensation, the print die in the agent delivery device 202 may more accurately be calibrated.

Some or all of the operations set forth in the methods 400-600 may be contained as utilities, programs, or subprograms, in any desired computer accessible medium. In addition, some or all of the operations set forth in the methods 400-600 may be embodied by computer programs, which may exist in a variety of forms both active and inactive. For example, they may exist as machine readable instructions, including source code, object code, executable code or other formats. Any of the above may be embodied on a non-transitory computer readable storage medium. Examples of non-transitory computer readable storage media include computer system RAM, ROM, EPROM, EEPROM, and magnetic or optical disks or tapes. It is therefore to be understood that any electronic device capable of executing the above-described functions may perform those functions enumerated above.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. An apparatus comprising:
    a processor; and
    a memory on which is stored machine readable instructions that are to cause the processor to:
        determine a size of a chip gap between a first sensor chip and a second sensor chip;
        access a model that estimates an amount of positional shift of a target centroid; and
        apply the determined chip gap size and the accessed model on an image captured using the first sensor chip and the second sensor chip to compensate for an estimated positional shift in a centroid of a calibration target in the captured image by causing a location of the calibration target centroid in the captured image to more accurately correspond to an actual location of the calibration target centroid on an object from which the captured image was captured.

2. The apparatus according to claim 1, wherein to access the model, the instructions are to cause the processor to select the model from a plurality of models, wherein each of the plurality of models corresponds to a different set of features including a location of a chip gap, a type of the target, and a size of the target.

3. The apparatus according to claim 1, wherein the accessed model corresponds to a particular chip gap size, and wherein to apply the determined chip gap size and the accessed model, the instructions are further to cause the processor to scale the accessed model using the determined chip gap size.

4. The apparatus according to claim 1, wherein to access the model, the instructions are further to cause the processor to generate the model to predict an impact of the chip gap on a measured target centroid.

5. The apparatus according to claim 4, wherein the instructions are further to cause the processor to generate the model using a simulation having as inputs, a location of the chip gap, a geometric shape of the target, and a size of the target.

6. The apparatus according to claim 1, wherein the first sensor chip and the second chip are aligned with respect to each other along a first direction, wherein a test pattern has a plurality of calibration targets arranged in a constant spaced relation with respect to each other along the first direction and the plurality of calibration targets are arranged in aligned rows along a second direction that is perpendicular to the first direction, and wherein to determine the size of the chip gap, the instructions are further to cause the processor to:
    determine, in a first subscanned row of the test pattern, a first distance between centroids of neighboring calibration targets;
    determine, in a second subscanned row of the test pattern, a second distance between centroids of neighboring calibration targets;
    compute an average distance of the first distance and second distance; and
    determine the size of the chip gap to be the computed average distance.

7. The apparatus according to claim 1, wherein the object includes a test pattern having a plurality of calibration targets printed by a print bar having a plurality of print die, and wherein the instructions are further to cause the processor to:
    calibrate positions of the plurality of print die using the location of the calibration target centroid in the captured image following compensation of the calibration target centroid in the captured image for the estimated positional shift caused by the chip gap.

8. The apparatus according to claim 1, wherein the instructions are further to cause the processor to:
    determine whether the calibration target in in the captured image is near a location in the captured image corresponding to a position of the chip gap;
    in response to a determination that the calibration target is near a location in the captured image corresponding to a position of the chip gap, determine whether the position corresponding to the chip gap is outside of the calibration target;
    in response to a determination that the position corresponding to the chip gap is outside of the calibration target, compensate for the estimated positional shift of the calibration target centroid using the determined chip gap size; and
    in response to a determination that the position corresponding to the chip gap is inside of the calibration target, compensate for the estimated positional shift of the calibration target centroid using the accessed model.

9. A method comprising:
    accessing, by a processor, a model that estimates a positional shift of a target centroid in an image due to an impact of a chip gap between sensor chips that were used to capture the image;
    accessing, by the processor, an image of a pattern of calibration targets captured with the sensor chips, the accessed image being impacted by the chip gap between the sensor chips;
    measuring, by the processor, a size of the chip gap from the accessed image of the pattern of calibration targets; and
    applying, by the processor, the accessed model and the measured chip gap size on the accessed image to compensate for an estimated positional shift caused by the chip gap in a centroid of the calibration target in the pattern of calibration targets to cause a location of the calibration target centroid in the accessed image to more accurately correspond to an actual location of the calibration target centroid on an object from which the accessed image of the pattern of calibration targets was captured.

10. The method according to claim 9, wherein the object includes a test pattern having a plurality of targets printed by a print bar having a plurality of print die, the method further comprising:
    calibrating positions of the plurality of print die using the location of the calibration target centroid in the accessed image following compensation of the calibration target centroid in the accessed image for the estimated positional shift caused by the chip gap.

11. The method according to claim 9, wherein accessing the model further comprises generating the model based upon a location of the chip gap, a type of the target, and/or a size of the target.

12. The method according to claim 9, wherein accessing the model further comprises generating the model using at least one of a simulation having as inputs, a location of the chip gap in the scan bar, a geometric shape of the target, and a size of the target.

13. The method according to claim 9, wherein accessing the model further comprises generating the model using determined distances between a plurality of targets in a test sample, wherein the plurality of targets are arranged in a predefined configuration on the test sample.

14. A non-transitory computer readable medium on which is stored machine readable instructions that when executed by a processor cause the processor to:
 access a model that estimates an amount of positional shift of an element centroid in a captured image caused by a chip gap between a first sensor chip and a second sensor chip in a scan bar used to capture the image;
 access an image including a calibration element captured with the scan bar, the location of the calibration element centroid in the accessed image being impacted by the chip gap between the sensor chips in the scan bar;
 measure a size of the chip gap from the accessed image; and
 compensate for an estimated positional shift of the calibration element centroid caused by the chip gap through application of at least one of the accessed model and the measured chip gap size to cause the location of the calibration element centroid in the accessed image to more accurately correspond to an actual location of the calibration element centroid on an object from which the accessed image was captured.

15. The non-transitory computer readable medium according to claim 14, wherein the object includes a test pattern having a plurality of calibration elements printed by a print bar having a plurality of print die, and wherein the instructions are further to cause the processor to:
 calibrate positions of the plurality of print die using the location of the calibration element centroid in the accessed image following compensation of the calibration element centroid in the accessed image for the estimated positional shift of the calibration element centroid caused by the chip gap.

* * * * *